United States Patent
Cox

(10) Patent No.: US 10,210,669 B1
(45) Date of Patent: Feb. 19, 2019

(54) METHOD FOR 3D OBJECT, ENVIRONMENT MODEL, AND DOCUMENTATION GENERATION USING SCAN POINT CLOUDS AND DIGITAL OBJECT LIBRARIES

(71) Applicant: THE UNITED STATES OF AMERICA AS REPRESENTED BY THE SECRETARY OF THE NAVY, Washington, DC (US)

(72) Inventor: Stephen C. Cox, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 43 days.

(21) Appl. No.: 15/173,046

(22) Filed: Jun. 3, 2016

(51) Int. Cl.
  *G06T 17/00* (2006.01)
  *G06T 19/20* (2011.01)
  *G06T 17/10* (2006.01)
  *G06F 17/50* (2006.01)

(52) U.S. Cl.
  CPC .......... *G06T 19/20* (2013.01); *G06F 17/5009* (2013.01); *G06T 17/10* (2013.01); *G06T 2207/10028* (2013.01)

(58) Field of Classification Search
  CPC ........ G06K 9/46; G06T 17/00; G06T 2210/56
  USPC ....................................................... 345/419
  See application file for complete search history.

(56) References Cited

U.S. PATENT DOCUMENTS

| | | | |
|---|---|---|---|
| 7,995,055 B1* | 8/2011 | Ma | G06K 9/4604 345/420 |
| 2010/0302247 A1* | 12/2010 | Perez | G06K 9/00201 345/440 |
| 2013/0207966 A1 | 8/2013 | Chu et al. | |
| 2013/0209965 A1* | 8/2013 | Fisker | A61C 13/0004 433/220 |
| 2014/0192050 A1 | 7/2014 | Qiu et al. | |
| 2016/0071318 A1* | 3/2016 | Lee | G06T 17/00 345/419 |

OTHER PUBLICATIONS

Rusinkiewicz, Szymon, Olaf Hall-Holt, and Marc Levoy. "Real-time 3D model acquisition." ACM Transactions on Graphics (TOG) 21.3 (2002): 438-446.*

* cited by examiner

*Primary Examiner* — Thomas J Lett
(74) *Attorney, Agent, or Firm* — SPAWAR Systems Center Pacific; Kyle Eppele; Elliott Deaderick

(57) ABSTRACT

A system and method provide for rapid generation of 3D models of complex environments by using a coordinate measurement machine to scan an environment having one or more objects to generate a point cloud comprising a plurality of points, analyzing the points without creating surfaces using the points to determine boundaries of the environment and boundaries of the object within the environment, excising a region of points within the point cloud representing the object, where the excised region of points is determined using the boundaries of the environment and the boundaries of the object, and creating a modified point cloud by replacing the excised region of points with a digital object from a digital object library.

20 Claims, 7 Drawing Sheets

METHOD FOR 3D OBJECT, ENVIRONMENT MODEL, AND DOCUMENTATION GENERATION USING SCAN POINT CLOUDS AND DIGITAL OBJECT LIBRARIES

FEDERALLY-SPONSORED RESEARCH AND DEVELOPMENT

The Method for 3D Object, Environment Model, and Documentation Generation Using Scan Point Clouds and Digital Object Libraries is assigned to the United States Government and is available for licensing for commercial purposes. Licensing and technical inquiries may be directed to the Office of Research and Technical Applications, Space and Naval Warfare Systems Center, Pacific, Code 72120, San Diego, Calif., 92152; voice (619) 553-5118; email ssc_pac_T2@navy.mil; reference Navy Case Number 103906.

BACKGROUND

Advancements in scanning and processing technology have made it possible to generate accurate 3D objects and 3D models of complex environments. However, such processes typically are very time consuming and require large amounts of data processing capability. This presents an issue for objects and environments where scan availability is of a very short duration, such as scanning a ship-board environment. A need exists for a system and method that allows for the rapid scanning of complex environments and for generation of associated 3D objects, 3D models, and documentation.

DETAILED DESCRIPTION OF SOME EMBODIMENTS

Figure 1:
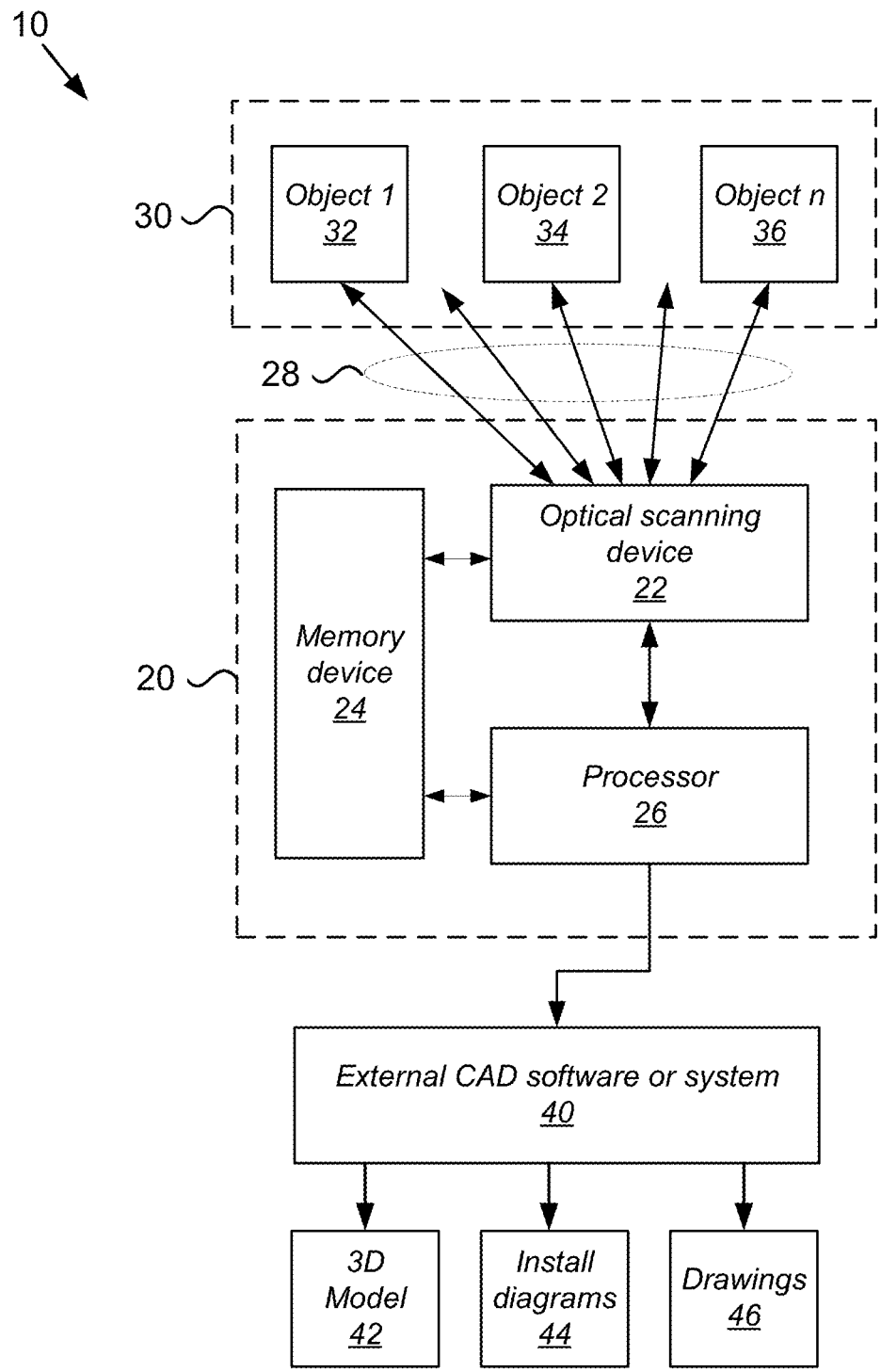
FIG. 1 shows a block diagram of an embodiment of a system in accordance with the Method for 3D Object, Environment Model, and Documentation Generation Using Scan Point Clouds and Digital Object Libraries.

Reference in the specification to "one embodiment" or to "an embodiment" means that a particular element, feature, structure, or characteristic described in connection with the embodiments is included in at least one embodiment. The appearances of the phrases "in one embodiment", "in some embodiments", and "in other embodiments" in various places in the specification are not necessarily all referring to the same embodiment or the same set of embodiments.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or.

Additionally, use of the "a" or "an" are employed to describe elements and components of the embodiments herein. This is done merely for convenience and to give a general sense of the invention. This detailed description should be read to include one or at least one and the singular also includes the plural unless it is obviously meant otherwise.

Further, the terms "around, "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

The embodiments disclosed herein involve a methodology that may be used to rapidly scan a complex 3D environment and generate 3D models of the environment or objects within the environment, as well as generate associated documentation. The accuracy and resolution provided by a 3D model may be highly beneficial for a variety of purposes including, but not limited to: configuration management, legacy part capture, as-built diagram requirements, installation diagrams, and the creation of virtual reality environments for training or other purposes.

Generally, to create a 3D model, an object is scanned with a laser, with each reflection of the laser creating a "point in space. The collection of points is called a point cloud. Each point and the two closest to it are selected by the computer to draw a triangle. Each triangle becomes a surface section of the model object. The collection of surfaces created is called a mesh. The mesh is rendered as a combination of simple geometries into a 3D computer-aided-design model. The number of points, size of triangular surfaces, and number of overlapping simplified geometries determines the resolution of the model. High resolution requirements may mean long process times and can lead to high costs to produce 3D models.

Figure 2:
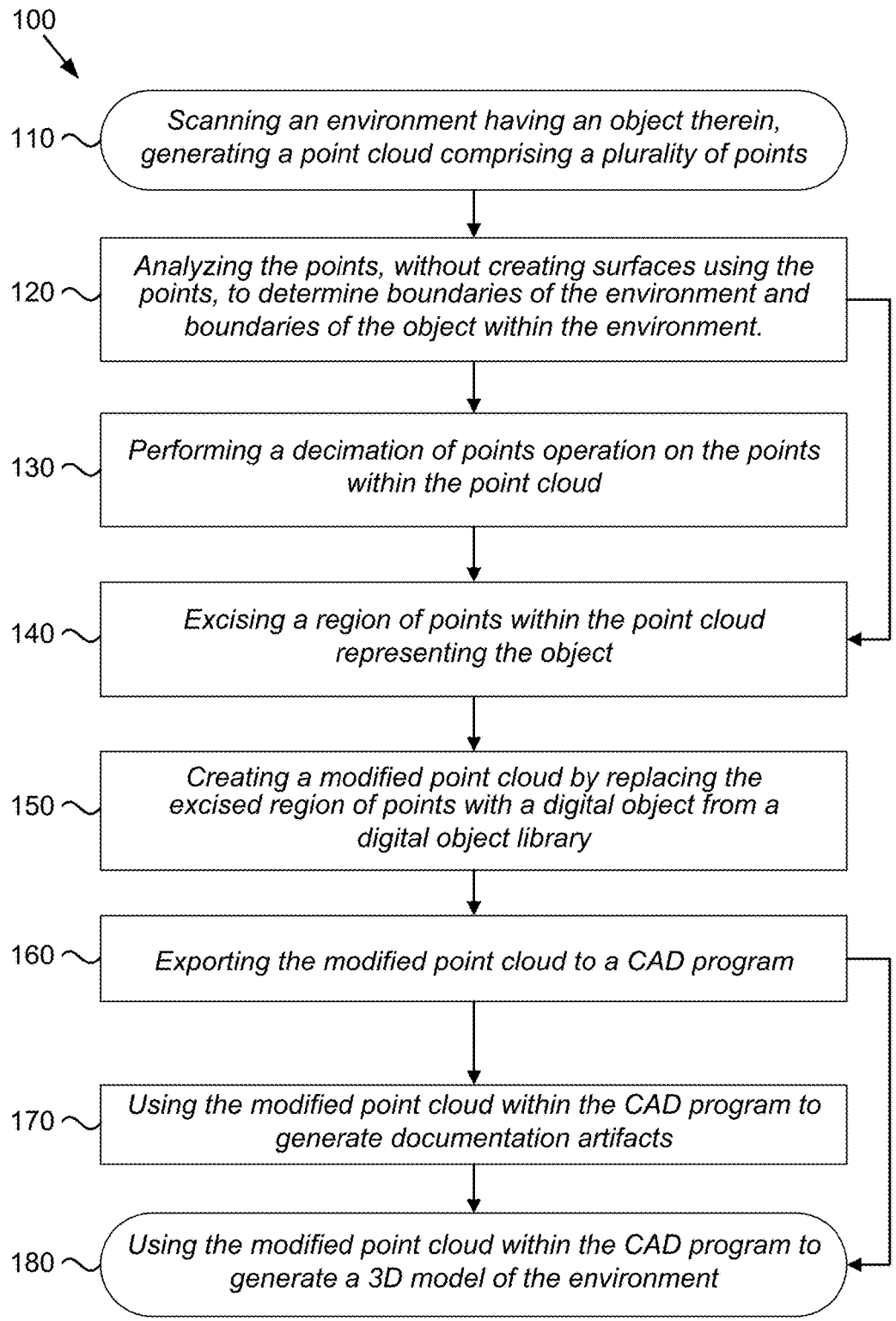
FIG. 2 shows a flowchart of an embodiment of a method in accordance with the Method for 3D Object, Environment Model, and Documentation Generation Using Scan Point Clouds and Digital Object Libraries.

FIG. 1 shows a diagram 10 of an embodiment of system 20 that may be used to perform the embodiments of the Method for 3D Object, Environment Model, and Documentation Generation Using Scan Point Clouds and Digital Object Libraries, including but not limited to, method 100 shown in FIG. 2. System 20 includes a coordinate measurement machine such as an optical scanning device 22, a memory device 24 operatively connected to optical scanning device 22, and a processor 26 operatively connected to both optical scanning device 22 and memory device 24.

Optical scanning device 22 is configured to scan an environment 30 having one or more objects therein. As part of the scan process, optical signals 28 are directed towards environment 30 and reflected or not reflected back to optical scanning device 22, depending upon whether or not the optical signals contacted an object within environment 30. As an example, environment 30 may be an indoor environment, an outdoor environment, the inside of a vessel, or any other environment containing an object.

As shown, environment 30 has a first object 32, a second object 34, and an $n^{th}$ object 36. However, environment 30 may have any number of objects. The scan generates a point cloud (such as shown in FIGS. 4A, 5A, 6A, and 7A) comprising a plurality of points. The point cloud represents the set of points that optical scanning device 22 has measured. The points are referenced using some coordinate system, such as a three-dimensional coordinate system typically defined by X, Y, and Z coordinates.

Memory device 24 is configured to store the point cloud and a digital object library therein. Processor 26 is configured with circuitry and software therein to perform the steps of the embodiments of the methods disclosed herein, such as method 100 discussed below with reference to FIG. 2. System 20 may be configured such that processor 26 is configured to communicate with external CAD software or system 40. A user may then use CAD software or system 40 to generate artifacts including a 3D model 42 of environment 30 or an object 32, 34, or 36 within environment 30, an installation diagram for an object 32, 34, or 36 within environment 30, and/or drawings 46 of environment 30 or an object 32, 34, or 36 within environment 30.

FIG. 2 shows a flowchart of an embodiment of a method 100 in accordance with the Method for 3D Object, Environment Model, and Documentation Generation Using Scan Point Clouds and Digital Object Libraries. As an example, method 100 may be performed by system 20 as shown in FIG. 1, and will be discussed with reference thereto. Further, while FIG. 2 shows one embodiment of method 100 to include steps 110-180, other embodiments of method 100 may contain fewer or more steps. Further, while in some embodiments the steps of method 100 may be performed as shown in FIG. 2, in other embodiments the steps may be performed in a different order, or certain steps may occur simultaneously with one or more other steps.

Method 100 may begin with step 110, which involves using a coordinate measurement machine to scan an environment having an object therein, with the scan generating a point cloud comprising a plurality of points. In some embodiments, the coordinate measurement machine is an optical scanning device. As an example, the optical scanning device is a laser scanner. However, other optical scanning devices may be used as would be recognized by one having ordinary skill in the art. In some embodiments, a scan of the whole environment is performed, while in other embodiments, a scan of a portion of the environment is performed, depending upon factors such as time availability for scanning and the particular objects desired for scanning.

In some embodiments, scanning priority is given by the user or programmed into the computer system such that scanning is directed toward the capture of the extents of the environment, such as walls, doors, bulkheads, hatches, etc., depending upon the type of environment. Secondarily, the scanning should capture enough points on objects within the environment to identify the object within the environment. Scanner placement should be chosen carefully to ensure proper scan origin points so the extents of the environment and the points of the objects are captured in the same scan. Prior to scanning, the operator is ideally aware of the intended use of the 3D model or artifacts to be created and what in the environment is significant and what is to be considered background. Such information will help to ensure that proper scanner placement is achieved and rescanning of the environment is unnecessary.

In some embodiments of method 100, step 110 may involve one scan of environment 30, as discussed above, while in other embodiments step 110 may involve multiple scans. In a multi-scan scenario, a first scan may focus on capturing the extents of the environment, such as walls, doors, etc . . . , as discussed above. As noted above, this scan is taken with the objective of capturing the boundaries and accesses at any elevation and only placement of objects rather than enough information to actually render the objects themselves. Any subsequent scans in the multi-scan embodiment may focus on scanning the particular objects within environment 30. Separating out the purpose of the scans helps achieve significant time reductions in scanning time. This is especially helpful if scanning requires the scan environment to be clear of personnel.

If multiple scans are taken of an environment, a user may, with appropriate viewing devices and programs configured to display such scans, be able to view all of the scans simultaneously to perform the analysis of the point clouds detailed in step 120.

As noted above, the scan generates a point cloud (such as shown in FIGS. 4A, 5A, 6A, and 7A) comprising a plurality of points. Step 120 involves analyzing the points, without creating surfaces using the points, to determine boundaries of the environment and boundaries of the object within the environment. Typical processing of point clouds involves surface reconstruction—or creating surfaces using the points—as the points by themselves are generally not directly usable for 3D applications. While there are many types of surfaces that may be created, such as polygonal mesh or triangular mesh surfaces, using methods such as Delaunay triangulation, alpha shapes, and ball pivoting, step 120 does not involve surface creation. Rather, step 120 involves using the points themselves to determine boundaries of environment 30 and boundaries of any objects 32, 34, and/or 36 within environment 30. As an example, point cloud processing may occur using software that is commercially available, such as the FARO SCENE software suite.

The analysis of the points in step 120 may involve a human user performing the analysis or a computer processor performing the analysis. In some embodiments, the analysis in step 120 involves a determination of where high densities of points and low densities of points are located within the environment, with high densities of points likely representing objects within the environment, a determination of locations within the environment where no points or very little points exist, and a determination using visual means or computer assisted means to ascertain the distance between boundaries of the objects and boundaries of the environment, with the boundaries of the environment being clearly represented by abrupt changes in the point cloud that would coincide with the expected shape/dimensions of the scanned environment.

In some embodiments, method 100 may proceed to step 130, which involves performing a decimation of points operation on the points within the point cloud. Point clouds are of variable density; as the distance laser travels increases, the distance between each beam path increases. Thus, cloud density is higher near the scanner and lower at range. Point cloud decimation helps to make the file size manageable, avoiding jerky video performance which makes edits to the model difficult. Decimation is the process of removing unneeded points, for example those on a smooth flat floor or wall, which are not required to improve 3D model quality.

One approach to point cloud decimation involves grid decimation, which removes all the points in a grid square but one. Using 16:1 decimation as an example, in a 4×4 square of 16 points, one point in the middle of the grid square is left. Another approach to point cloud decimation, as disclosed herein, is to base the decimation on distance. As an example, all points in the point cloud closer than ½" to each other are removed. Use of this approach can result in a better uniformity in point cloud density. One example of commercial distance-based decimation algorithms is found within the GeoMagic Design X software suite, which may also be used to render the point cloud.

Figure 3:
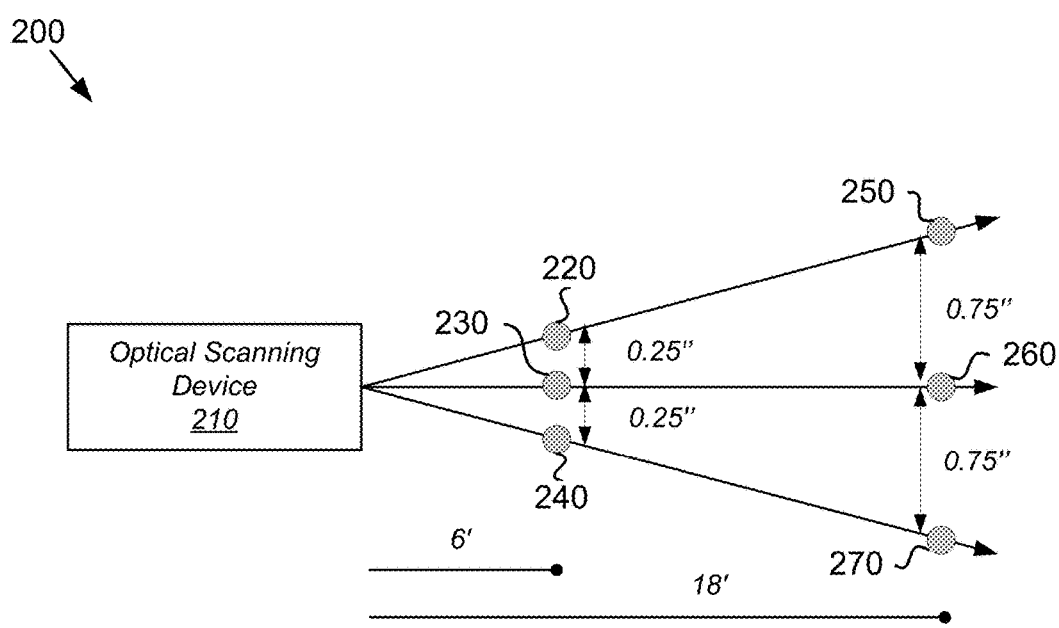
FIG. 3 shows a diagram illustrating a decimation of points operation based upon distance from an optical scanning device.

FIG. 3 shows a diagram 200 illustrating a decimation of points operation based upon distance from an optical scanning device 210. For illustration purposes, there are two sets of points that are scanned—a first set of points 220, 230, and 240 and a second set of points 250, 260, and 270. The first set of points is located at a distance of 6 feet from optical scanning device 210, while the second set of points is located 18 feet away. It should be recognized that the distances of the points from optical scanning device 210 may vary. Using, as an example, decimation where all points closer than ½" to each other are removed, point 230 of the first set of points would be decimated (removed) because it is closer than ½" from points 220 and 240, whereas point 260 of the second set would be kept because it is greater than ½" from points 250 and 270.

Figures 4A, 4B, 4C:
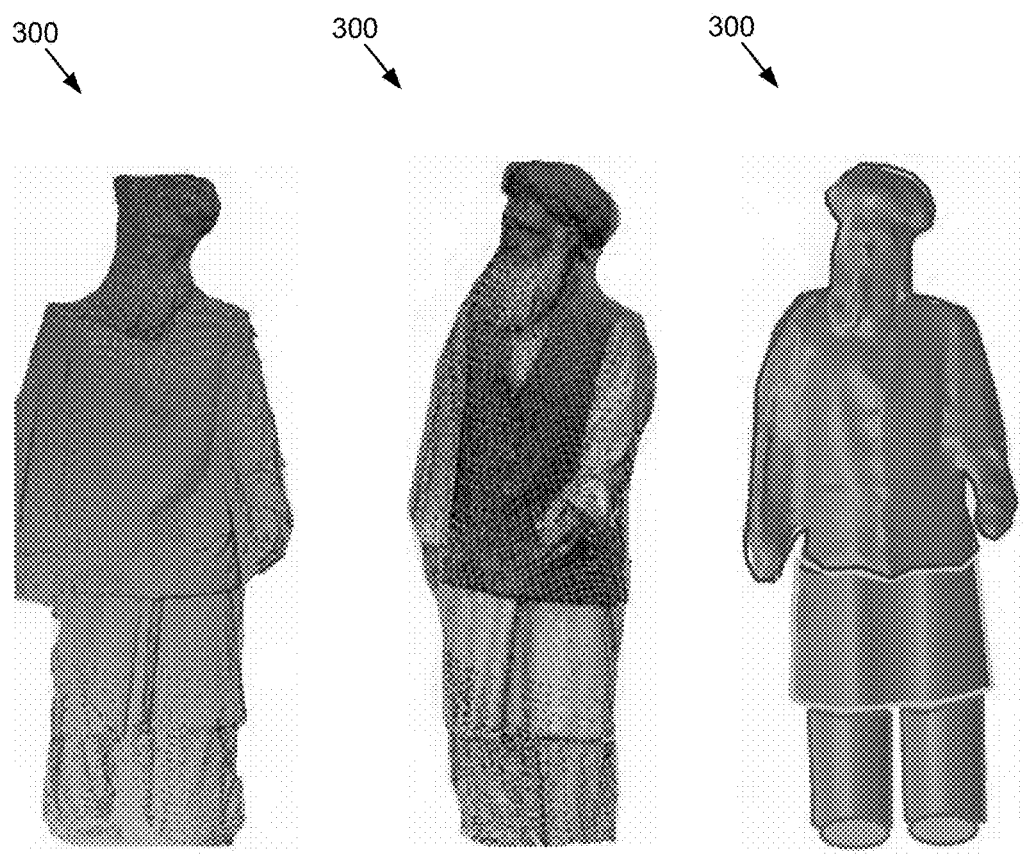
FIG. 4A shows a point cloud diagram of a person generated using an optical scanning device.
FIG. 4B shows the point cloud diagram of FIG. 4A with a color overlay.
FIG. 4C shows a 3D CAD model diagram generated using traditional methods.

Using a person 300 shown in FIGS. 4A-4C as an example, the scanning process, which may take for example 20 minutes, produces a point cloud such as shown in FIG. 4A. Next, the typically processing of that point cloud may involve generating a color overlay for the person 300, which may take 5 minutes, with the result shown in FIG. 4B. The next step of completing a 3D CAD model using of person 300 using traditional methods, could take between 2 and 3 hours. For instance, the creation of an upper torso for person 300 using mesh surfacing could take 2 hours, the lower torso creation could be created by extrusion with a draft from the scan, taking approximately 15 minutes, and the leg portion of person 300 could be drawn as standard geometry, taking about 5 minutes. In total, person 300 could be created in about 2 hours and 20 minutes. For an environment 30 containing many objects, people, or foliage, the total amount of time for rendering a 3D model of environment 30 can be well over 100 hours.

In some embodiments, after step 120, method 100 may proceed directly to step 140. Step 140 involves excising a region of points within the point cloud representing the object. As an example, the excised region of points is determined using the boundaries of the environment and the boundaries of the object determined in step 120. Further, the excising of the region of points representing the object may be performed by a human user analyzing the point cloud or may be automatically performed by an appropriately-configured processor or computer system.

In some embodiments, the excised region of points represents a complex object. As an example, the complex object comprises one of an organic object, a person, and foliage. As an example, an organic object is one that has a lot of surface area in which segments of the surfaces point in different directions. Foliage may be considered a specific type of organic object. In some embodiments, the excised region of points represents a non-standard object that is not found within the digital object library. In some embodiments, the excised region of points represents an object realizable by a simplified geometry. As an example, the simplified geometry may be one of a wall, floor, door, and window.

Method 100 may then proceed to step 150, which involves creating a modified point cloud by replacing the excised region of points with a digital object from a digital object library. Using a digital object from a digital object library significantly reduces the amount of time required to generate a 3D model of the object and the environment, as much of the complex surface rendering can be avoided. Prior to using the digital object library, an operator should review the digital object library to determine whether or not the appropriate environment digital object models are contained therein.

In some embodiments, the digital object library is a generic library including a wide range of digital objects. In some embodiments, the digital object library is specific, including types of digital objects that may be found in a particular environment. For example, if scanning interior rooms of a building, the digital object library can include items that are generally found in rooms of a building, such as chairs, desks, tables, etc. As another example, the digital library may also be tailed specifically to the exact environment being scanned, provided that the environments are configured the same or very similar. For example, if a ship compartment is being scanned, the digital object library used may be specific to the exact compartment of the exact ship being scanned. In some embodiments, the digital object library contains a combination of any of the types of digital objects discussed above.

Figure 5A:
FIG. 5A shows a point cloud diagram of a complex environment generated using an optical scanning device.

In embodiments where the excised region of points represents a complex object, the digital object matches the complex object. In embodiments where the excised region of points represents a non-standard object that is not found within the digital object library, the digital object resembles the non-standard object. As an example, FIG. 5A shows a diagram of an environment 400 that includes several objects including three palm trees, which are also shown as tree 500 in FIG. 6A. A user or automated software program can determine that the specific palm trees are not found in the digital object library. The user or software can then excise the region of points representing the trees and replace the trees with the trees shown in environment 400 shown in FIG. 5B and also shown in FIG. 6B. While the trees may look different, they are similar and the end user of the 3D model may only be concerned about the fact that there are three trees located in a particular location within, vice the specific type of trees located within the environment.

Figure 5B:
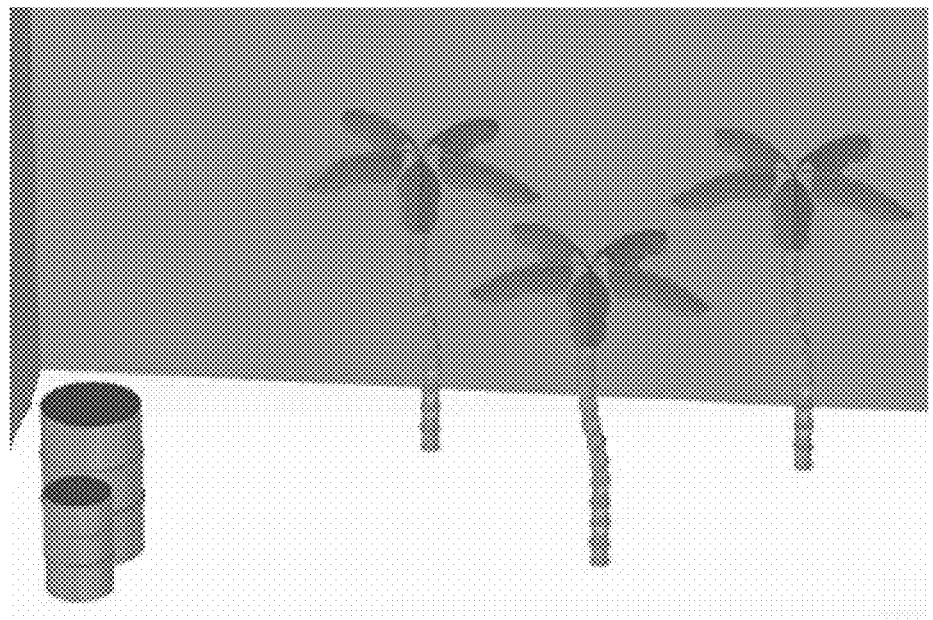
FIG. 5B shows a 3D CAD model diagram of the complex environment generated in accordance with the methods disclosed herein using objects from a digital object library.
Figure 6A:
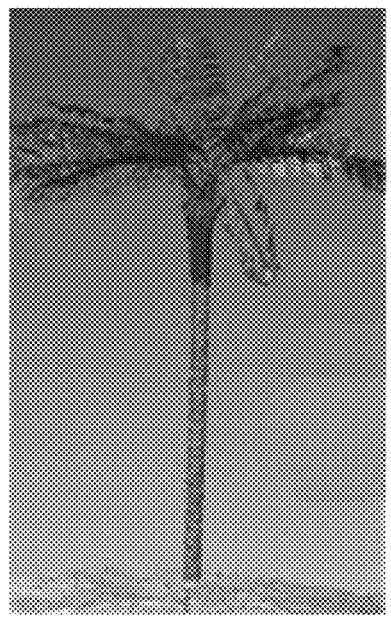
FIG. 6A shows a point cloud diagram of a tree generated using an optical scanning device.
Figure 6B:
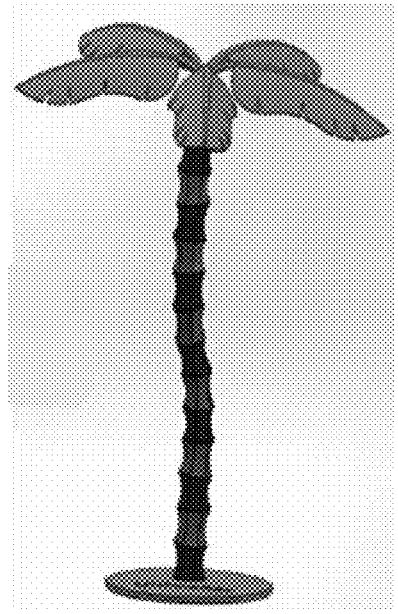
FIG. 6B shows a 3D CAD model diagram of a tree generated in accordance with the methods disclosed herein using an object from a digital object library.

Further, the user or software program may determine that some features shown in environment 400 are unnecessary for showing in a 3D model (or any associated documentation artifact). The user or program may make this determination based upon information known beforehand about the use or purposes for which the 3D model of the environment is being generated. Accordingly, any such items may be excised and not replaced, as is shown in FIGS. 5A and 5B, where some items are missing from FIG. 5B that are shown as points in the point cloud shown in FIG. 5A.

Figure 7A:
FIG. 7A shows a point cloud diagram of a hand cart generated using an optical scanning device.
Figure 7B:
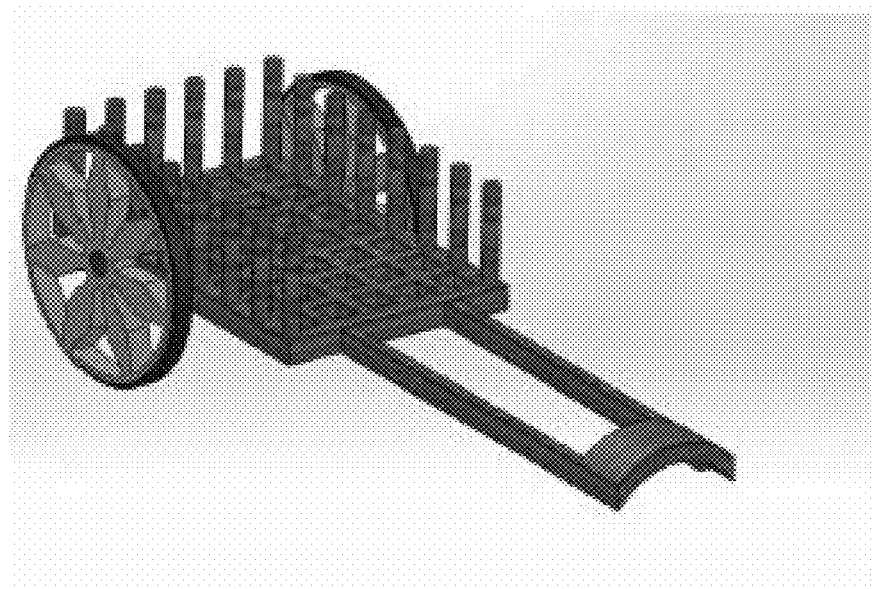
FIG. 7B shows a 3D CAD model diagram of a hand cart generated in accordance with the methods disclosed herein using an object from a digital object library.

Further, in embodiments where the excised region of points represents an object realizable by a simplified geometry, the digital object has the simplified geometry. As an example, FIG. 7A shows a point cloud generated by a scan of a hand cart 600. The hand cart shown in FIG. 7A includes several items that are on the hand cart. It may be of no interest to the end user of the 3D model what these exact items are, or what specific type of hand cart is located within the environment. Accordingly, the user or software program may determine that a hand cart having a simplified geometry will suffice for purposes of illustration. Thus, the user or software program may excise the region of points representing the hand cart from the point cloud and replace that region with an object from the digital object library such as the hand cart 600 having a simplified geometry as shown in FIG. 7B.

After the user or software program has made the changes to the point cloud and created the modified point cloud, in some embodiments, method 100 may proceed to step 160. Step 160 involves exporting the modified point cloud to a computer aided design (CAD) program. There are several well-known CAD programs that are currently commercially available, such as SolidWorks, and the methods disclosed herein are not limited to any particular version of CAD program or any particular CAD program from a specific manufacturer.

In some embodiments, method 100 may then proceed to step 170, which involves using the modified point cloud within the CAD program to generate one or more documentation artifacts. As an example, the documentation artifacts may comprise at least one of engineering drawings of the environment and/or objects within the environment, as well as installation diagrams that may be used to install/remove objects within the environment. Such engineering drawings may be critical for creating replacement parts if such replacement parts are no longer available in the commercial marketplace.

In some embodiments, rather than proceeding to step 170, method 100 proceeds directly from step 160 to step 180. In other embodiments, method 100 proceeds from step 170 to step 180. Step 180 involves using the modified point cloud within the CAD program to generate a 3D model of the environment or 3D models of objects within the environment. A person having skill in the art and experience using 3D CAD programs would only need to use such CAD programs in their normal operating manner and would understand how such 3D models and documentation artifacts are created. Further, it should be understood that other steps may be included before a 3D model is generated, such as colorizing objects and/or the environment to introduce more complexity and realism, as would be understood by a person having ordinary skill in the art.

In some embodiments, method 100 may be implemented as a series of modules, either functioning alone or in concert, with physical electronic and computer hardware devices. Method 100 may be computer-implemented as a program product comprising a plurality of such modules, which may be displayed for a user. Method 100 may be implemented on a processor, a field programmable gate array (FPGA), or a stand-alone microelectronic chip, or a combination of them.

Various storage media, such as magnetic computer disks, optical disks, and electronic memories, as well as non-transitory computer-readable storage media and computer program products, can be prepared that can contain information that can direct a device, such as a micro-controller, to implement the above-described systems and/or methods. Once an appropriate device has access to the information and programs contained on the storage media, the storage media can provide the information and programs to the device, enabling the device to perform the above-described systems and/or methods.

For example, if a computer disk containing appropriate materials, such as a source file, an object file, or an executable file, were provided to a computer, the computer could receive the information, appropriately configure itself and perform the functions of the various systems and methods outlined in the diagrams and flowcharts above to implement the various functions. That is, the computer could receive various portions of information from the disk relating to different elements of the above-described systems and/or methods, implement the individual systems and/or methods, and coordinate the functions of the individual systems and/or methods.

Many modifications and variations of the Method for 3D Object, Environment Model, and Documentation Generation Using Scan Point Clouds and Digital Object Libraries are possible in light of the above description. Within the scope of the appended claims, the embodiments of the systems described herein may be practiced otherwise than as specifically described. The scope of the claims is not limited to the implementations and the embodiments disclosed herein, but extends to other implementations and embodiments as may be contemplated by those having ordinary skill in the art.

I claim:

1. A method comprising the steps of:
   using a coordinate measurement machine to scan an environment having an object therein, the scan generating a point cloud comprising a plurality of points;
   analyzing the points, without creating surfaces using the points, to determine boundaries of the environment and boundaries of the object within the environment;
   excising a region of points within the point cloud representing the object, wherein the excised region of points is determined using the boundaries of the environment and the boundaries of the object; and
   creating a modified point cloud by replacing the excised region of points with a digital object from a digital object library.

2. The method of claim 1, wherein the excised region of points represents a complex object, wherein the digital object matches the complex object.

3. The method of claim 2, wherein the complex object comprises one of an organic object, a person, and foliage.

4. The method of claim 1, wherein the excised region of points represents a non-standard object that is not found within the digital object library, wherein the digital object resembles the non-standard object.

5. The method of claim 1, wherein the excised region of points represents an object realizable by a simplified geometry, wherein the digital object has the simplified geometry.

6. The method of claim 5, wherein the simplified geometry comprises one of a wall, floor, door, and window.

7. The method of claim 1 further comprising the step of, prior to the step of excising a region of points within the point cloud representing the object, performing decimation of points operation on the points within the point cloud.

8. The method of claim 1 further comprising the step of exporting the modified point cloud to a computer assisted design (CAD) program.

9. The method of claim 8 further comprising the step of using the modified point cloud within the CAD program to generate one or more documentation artifacts.

10. The method of claim 9, wherein the documentation artifacts comprise at least one of drawings and installation diagrams.

11. The method of claim 8 further comprising the step of using the modified point cloud within the CAD program to generate a 3D model of the environment.

12. The method of claim 1, wherein the coordinate measurement machine is an optical scanning device.

13. A method comprising the steps of:
using an optical scanning device to perform more than one scans of an environment having an object therein, wherein each scan occurs from a different point of view of the environment, wherein each scan generates a point cloud comprising a plurality of points;
analyzing the points of the point cloud generated from each scan, without creating surfaces using the points, to determine boundaries of the environment and boundaries of the object within the environment;
excising a region of points within one of the point clouds representing the object, wherein the excised region of points is determined using the boundaries of the environment and the boundaries of the object; and
creating a modified point cloud by replacing the excised region of points with a digital object from a digital object library.

14. The method of claim 13, wherein the excised region of points represents a complex object, wherein the digital object matches the complex object.

15. The method of claim 13, wherein the excised region of points represents a non-standard object that is not found within the digital object library, wherein the digital object resembles the non-standard object.

16. The method of claim 13, wherein the excised region of points represents an object realizable by a simplified geometry, wherein the digital object has the simplified geometry.

17. The method of claim 13 further comprising the step of exporting the modified point cloud to a CAD program.

18. The method of claim 17 further comprising the step of using the modified point cloud within the CAD program to generate one or more documentation artifacts including at least one of drawings and installation diagrams.

19. The method of claim 17 further comprising the step of using the modified point cloud within the CAD program to generate a 3D model of the environment.

20. A system comprising:
an optical scanning device configured to scan an environment having an object therein, wherein the scan generates a point cloud comprising a plurality of points;
a memory device operatively connected to the optical scanning device, the memory device configured to store the point cloud and a digital object library therein; and
a processor operatively connected to the optical scanning device and the memory device, the processor configured with circuitry and software therein to perform the steps of analyzing the points, without creating surfaces using the points, to determine boundaries of the environment and boundaries of the object within the environment, excising a region of points within the point cloud representing the object, wherein the excised region of points is determined using the boundaries of the environment and the boundaries of the object, and creating a modified point cloud by replacing the excised region of points with a digital object from the digital object library.

\* \* \* \* \*